United States Patent
Bell et al.

(10) Patent No.: US 7,617,467 B2
(45) Date of Patent: Nov. 10, 2009

(54) ELECTROSTATIC DISCHARGE DEVICE VERIFICATION IN AN INTEGRATED CIRCUIT

(75) Inventors: David Averill Bell, Zionsville, PA (US); Che Choi Leung, Bethlehem Township, Northampton County, PA (US); Daniel Mark Wroge, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 297 days.

(21) Appl. No.: 11/610,825

(22) Filed: Dec. 14, 2006

(65) Prior Publication Data

US 2008/0148199 A1    Jun. 19, 2008

(51) Int. Cl.
*G06F 17/50* (2006.01)
(52) U.S. Cl. ............... 716/5; 716/1; 716/4; 716/8; 716/9; 716/11; 716/12; 703/14
(58) Field of Classification Search .............. 716/1, 716/2, 4, 5, 8, 9, 11, 12; 703/14; 361/56
See application file for complete search history.

(56) References Cited

U.S. PATENT DOCUMENTS

| | | | | |
|---|---|---|---|---|
| 6,087,841 A | * | 7/2000 | Bonaccio et al. | 324/757 |
| 6,249,410 B1 | * | 6/2001 | Ker et al. | 361/56 |
| 6,553,542 B2 | * | 4/2003 | Ramaswamy et al. | 716/2 |
| 6,725,439 B1 | * | 4/2004 | Homsinger et al. | 716/12 |
| 7,065,728 B2 | * | 6/2006 | Bakir et al. | 716/8 |
| 7,114,137 B2 | * | 9/2006 | Hayashi | 716/4 |
| 7,164,566 B2 | * | 1/2007 | Xu et al. | 361/56 |
| 7,302,378 B2 | * | 11/2007 | Hayashi | 703/14 |
| 7,312,517 B2 | * | 12/2007 | Hirata | 257/678 |
| 7,350,160 B2 | * | 3/2008 | Perez et al. | 716/1 |
| 7,451,414 B2 | * | 11/2008 | Groos | 716/5 |
| 2008/0134119 A1 | * | 6/2008 | Chen et al. | 716/9 |
| 2009/0019414 A1 | * | 1/2009 | Eshun et al. | 716/11 |

FOREIGN PATENT DOCUMENTS

JP    2008108091 A    *  5/2008

* cited by examiner

*Primary Examiner*—Helen Rossoshek
(74) *Attorney, Agent, or Firm*—Ryan, Mason & Lewis, LLP (57) ABSTRACT

Processor-implemented techniques for verifying ESD device connectivity in an IC include the steps of: receiving an input dataset including layout parameters corresponding to the integrated circuit; identifying ESD devices based at least in part on the input dataset; extracting devices and parasitic elements in at least a portion of the integrated circuit based at least in part on the input dataset; generating a file including connectivity information and dimensional characteristics for extracted devices and parasitic elements associated with at least the identified ESD devices in the integrated circuit; identifying at least one ESD test based on the identified ESD devices and on connectivity to the identified ESD devices; and performing a linear network analysis for each identified ESD test based at least in part on the file.

19 Claims, 7 Drawing Sheets

ELECTROSTATIC DISCHARGE DEVICE VERIFICATION IN AN INTEGRATED CIRCUIT

FIELD OF THE INVENTION

The present invention relates generally to integrated circuit (IC) testing, and more particularly relates to verifying electrostatic discharge (ESD) device functionality and/or connectivity in an IC.

BACKGROUND OF THE INVENTION

Presently, electrical testing of fabricated ICs is used to minimize the number of ESD problems that can occur. Unfortunately, correcting design-related problems discovered in silicon, after IC fabrication, is costly, primarily because of the time and expense of regenerating new reticles and fabricating new silicon. Additionally, IC fabrication delays can disrupt customer production and delivery schedules, thereby increasing costs even further. Consequently, it is desirable to ascertain ESD-related problems earlier in the design cycle, prior to IC fabrication.

One mechanism leading to ESD failure involves insufficient connections to ESD protection devices in the IC (e.g., metal too narrow or insufficient number of conductive vias). Another mechanism which can lead to ESD failure in the IC involves power and ground networks having excessive resistance and/or improper connections. Even if a chip- or block-level data base is constructed using previously tested input/output (I/O) cells, there can still be ESD failures due, at least in part, to the manner in which such cells are connected. For example, an I/O cell connection to an ESD power clamp is generally critical to ESD robustness. If that connection is poor, the ESD protection voltage for the IC could be significantly lower than the ESD protection voltage for the I/O cell or the ESD power clamp separately.

Conventional techniques for minimizing ESD device failures include generating a set of standard ESD cells that have been previously characterized. One disadvantage with this approach, however, is that it does not allow for product-specific optimization, and furthermore does not cover the top hierarchy connection into these cells. Additionally, this methodology generally requires substantial time to fabricate and pre-characterize any new cells added to the existing set of standard ESD cells.

Another approach for minimizing ESD device failures in the IC is to utilize a computer-aided design (CAD) infrastructure to verify ESD robustness. For example, ALSIM-ESD is a design automation tool (commercially available from IBM Corporation) to analyze power networks for good ESD performance in a high-volume, highly automated application specific integrated circuit (ASIC) design system. The tool calculates the voltage drop produced in the power network by an ESD discharge event and checks that it remains below prescribed circuit failure voltages. ALSIM-ESD utilizes linearized ESD device models, which is overly optimistic since doing so would neglect device turn-on voltage. This device-based approach increases an impact of model inaccuracies and also makes it more difficult to subdivide the ESD verification problem, as is often desirable in a parallel processing environment.

Accordingly, there exists a need for techniques for verifying ESD device connectivity in an IC device, which do not suffer from one or more of the above-noted problems exhibited by conventional ESD testing and verification methodologies.

SUMMARY OF THE INVENTION

The present invention meets the above-noted need by providing, in an illustrative embodiment thereof an automated ESD verification methodology for verifying connectivity and functionality of ESD devices in an IC. These automated checks are based on technology specific electrical rules which are determined by running ESD testers during technology development. The rule-based ESD verification methodologies of the invention replace manual checks which are prone to errors as well as CAD ESD verification approaches which do not provide sufficient accuracy. Moreover, the inventive methodologies are operative to identify ESD problems for new structures in new applications prior to silicon fabrication. Unlike prior art techniques, by focusing on ESD device connectivity it is easier to subdivide the ESD verification problem and generate the desired ESD tests for assuring reliability.

In accordance with one aspect of the invention, a computer-implemented method for verifying ESD device connectivity in an IC includes the steps of: receiving an input dataset including layout parameters corresponding to the integrated circuit; identifying ESD devices based at least in part on the input dataset; extracting devices and parasitic elements in at least a portion of the integrated circuit based at least in part on the input dataset; generating a file including connectivity information and dimensional characteristics for extracted devices and parasitic elements associated with at least ESD protection circuitry in the integrated circuit; identifying at least one ESD test based on the identified ESD devices and on connectivity to the respective ESD devices; and performing a linear network analysis for each identified ESD test based at least in part on the file evaluated under ESD conditions, the identified ESD devices being removed from the network analysis, the network analysis being used to ensure that current densities through respective conductive connections included in the identified ESD test are less than or equal to a first prescribed threshold, and/or voltage drops associated with the respective conductive connections are less than or equal to a second prescribed threshold.

In accordance with another aspect of the invention, a system for verifying ESD device connectivity in an IC includes memory and at least one processor coupled to the memory. The processor is operative: (i) to receive an input dataset including layout parameters corresponding to the integrated circuit; (ii) to identify ESD devices based at least in part on the input dataset; (iii) to extract devices and parasitic elements in at least a portion of the integrated circuit based at least in part on the input dataset; (iv) to generate a file including connectivity information and dimensional characteristics for extracted devices and parasitic elements associated with at least ESD protection circuitry in the integrated circuit; (v) to identify at least one ESD test based on the identified ESD devices and on connectivity to the respective ESD devices; and (vi) to perform a linear network analysis for each identified ESD test, based at least in part on the file, evaluated under ESD conditions, the identified ESD devices being removed from the network analysis, the network analysis being used to ensure at least one of: that current densities through respective conductive connections included in the identified ESD test are less than or equal to a first prescribed threshold; and that voltage drops associated with the respective conductive connections are less than or equal to a second prescribed threshold.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative electronic design automation tool for performing enhanced ESD simulation in an IC. While reference may be made herein to certain ESD circuitry in the IC, it is to be understood that the present invention is not limited to these or any particular ESD circuit arrangements. Rather, the invention is more generally applicable to techniques for advantageously verifying ESD device connectivity and/or functionality in an IC. Techniques of the present invention provide an ESD verification methodology that affords IC designers the freedom to create new I/O topologies optimized for their specific application, without relying on manual verification which is prone to errors. Moreover, the ESD verification methodology of embodiments of the invention is based on a final IC layout and does not require ESD device current-voltage (IV) modeling. Unlike conventional approaches, the present invention takes into account both power and ground networks to thereby improve an accuracy of the ESD device connectivity verification.

Figure 1:
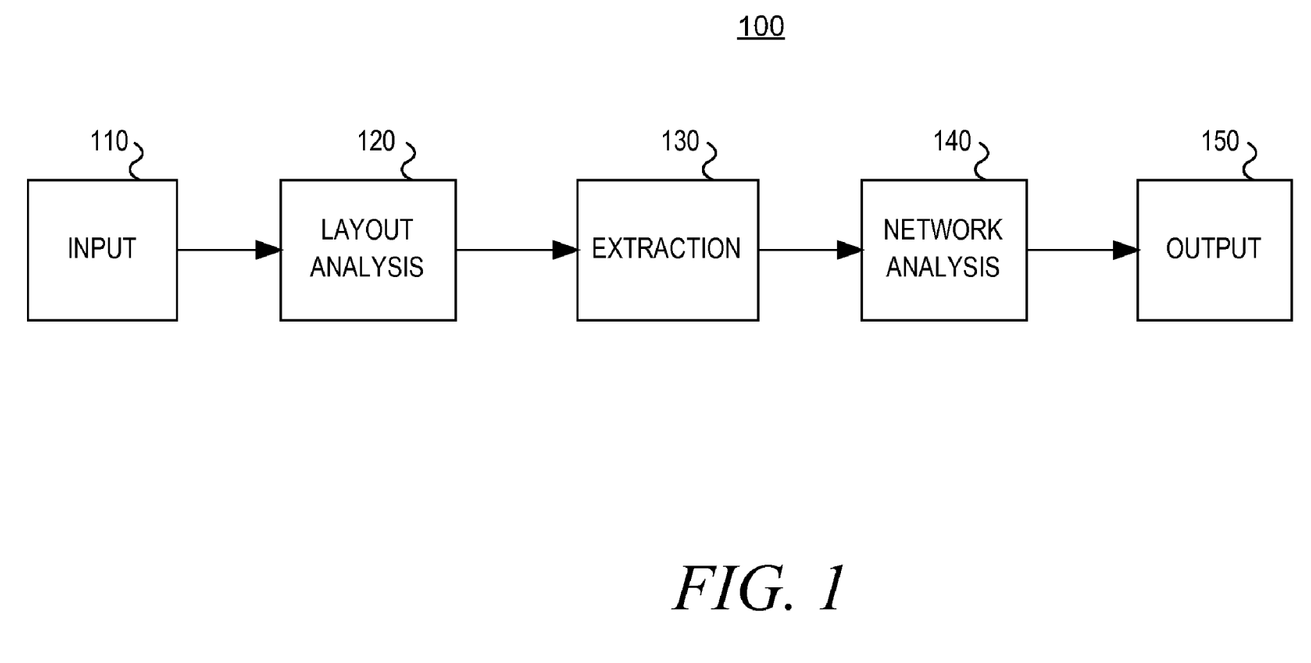
FIG. 1 is a simplified flow diagram showing an exemplary method for verifying connectivity and functionality of ESD devices in an IC, in accordance with an embodiment of the present invention.

FIG. 1 is a simplified flow diagram showing an exemplary method 100 for verifying connectivity and/or functionality of ESD devices in an IC, in accordance with an embodiment of the invention. As apparent from the figure, illustrative method 100 includes an input step 110, a layout analysis step 120, an extraction step 130, a network analysis step 140, and an output step 150. Each of these steps, which may, itself, comprise a plurality of steps, will be described in further detail herein below. It is to be appreciated that, in accordance with alternative embodiments of the invention, other steps and/or additional steps may be performed to provide further enhancements, as will become apparent to those skilled in the art. Moreover, method 100 is depicted conceptually as individual functional blocks, although it is contemplated that one or more of the steps shown may be combined with one another or with other functional steps to form a fewer number of blocks. Similarly, one or more steps in method 100 may be divided into a plurality of functional sub-blocks. Thus, the invention is not limited to the particular number of functional blocks shown.

Method 100 begins in step 110, wherein an input dataset including various layout parameters relating to the IC is received. Such layout parameters may comprise, for example, physical attributes of the IC design (e.g., coordinates of different physical layers—metal, contact, diffusion, polysilicon, etc.) and/or non-physical attributes (e.g., annotation layers, pad names, power, ground and I/O associations, designation of certain regions in the IC, etc.). A given layout parameter can be physical or logical (non-physical); either instance-based or net-based; and flat or hierarchical. The latter can be folded or unfolded. It is also contemplated that, rather than receiving the layout parameters as an input, such layout parameters may be generated by method 100 itself, either as a part of step 110 or as a separate functional block (not shown).

Preferably, the layout parameters include trigger layers, which identify certain ESD components in the IC, including, but not limited to, diodes, n-channel metal-oxide-semiconductor (NMOS) snapback devices, power clamps, pad names, coordinates, etc. The input dataset may also include power, ground, and I/O associations, also referred to as PGI associations, which may include a list of power and ground combinations that support MOS devices and/or which may absorb ESD current for each I/O pad in the IC. The layout parameters can be generated, for example, from a layout database (e.g., in Graphic Data System (GDS) II format, owned by Cadence Design Systems, Inc., or Open Artwork System Interchange Standard (OASIS) format), although alternative means for generating the layout parameters are contemplated. For example, the PGI associations may be specified by the user separate from a GDS file but this user input could still be considered part of the dataset. A netlist or alternative file (e.g., table, etc.), which describes the connectivity of an electronic design implemented in the IC, may be derived from the layout parameters.

In step 120, the layout parameters received as input in step 110 are analyzed. This layout analysis preferably includes at least identifying ESD devices in the IC based, at least in part, on the input dataset. ESD device identification may involve manipulation of the IC layout, such as, for example, by parsing ESD trigger layers included in the layout parameters to create one or more ESD device identification regions in the IC. Step 120 preferably further includes distinguishing n- and p-polarity terminals for identified ESD devices based, at least in part, on the input dataset. The layout analysis step 120 may also include reducing the complexity of the layout, such as, for example, by netlist trimming, in order to simplify the subsequent network analysis step 140, as will be described in further detail below with reference to FIG. 2.

Step 130 in method 100 preferably comprises extracting devices and parasitic elements in at least a portion of the IC (e.g., ESD identification region) based at least in part on the input dataset. Parasitic elements, unlike designed devices that are deliberately created by the designer, are devices which are not explicitly intended by the designer but are inherent in the layout of the circuit and may therefore affect operation of the circuit. Perhaps the most common parasitic element is parasitic resistance, which may include resistance inherent in device interconnections (e.g., metal and polysilicon), contacts, vias, etc., although other parasitic elements may also be present (e.g., parasitic capacitance and inductance). Thus, the extraction process can be divided into two steps, namely, device extraction (which includes discrete devices, parasitic diodes, and the connectivity) and parasitic extraction (which includes interconnect resistance, capacitance, inductance). These parts are interrelated since various device extractions can change the connectivity of the circuit. For instance, resistors, whether designed or parasitic, convert single nets (e.g., wires or other conductors which connect components together) into multiple electrical nodes.

Preferably, the extraction of the ESD identification region(s), as may be defined by an ESD trigger layer(s), in the IC is performed twice: once to extract n-polarity terminals and again to extract p-polarity terminals. The extraction of n- and p-polarity device terminals enables the IC network to be partitioned so as to advantageously simplify the network analysis step 140, as will explained in further detail herein below. Based on the extraction process, one or more netlists are preferably generated in step 130 including connectivity information and dimensional characteristics for the extracted devices and parasitic elements associated with at least ESD protection circuitry in the IC. Dimensional characteristics may include, but are not limited to, geometric attributes of devices and connections in at least a portion of the IC (e.g., length and width). Various known electronic design automation (EDA) tools may be employed to perform device and parasitic extraction, including, but not limited to, Hercules™ (a trademark of Synopsis, Inc.) LVS (layout verses schematic) or Calibre™ (a trademark of Mentor Graphics Corporation) LVS, for device extraction, followed by Star-RCXT™ (a trademark of Synopsis, Inc.), for parasitic extraction; or VoltageStorm® XT (a registered trademark of Cadence Design Systems, Inc.), for device extraction, followed by Fire & Ice® QX (a registered trademark of Cadence Design Systems, Inc.), for parasitic extraction.

In step 140, at least one ESD test is identified based at least in part on the ESD devices identified in step 120 and on connectivity to the respective ESD devices. Once the ESD tests are identified, linear network analysis is performed for each ESD test under ESD conditions. Because current flow in the ESD devices is unidirectional, the current flow direction in a specific ESD terminal is unique. An ESD device terminal which can inject current into the network is defined to be an n-polarity terminal. The current will flow through the network into another ESD device terminal, defined to be a p-polarity terminal, or into a pad. The network analysis is preferably performed using a given ESD device terminal as either a current injection node, as in the case of, for example, an n-polarity terminal, or as current return node, as in the case of, for example, a p-polarity terminal. Alternatively, a voltage source may be applied to a given ESD device terminal (e.g., n-polarity terminal) or the given terminal may be grounded, and the total resistance in a given interconnection and/or total voltage drop may be measured. Thus, the ESD identification region is used as a current and/or a voltage injection point in the step of performing the linear network analysis.

By way of example only, one ESD test may comprise injecting a known current into a given n-polarity ESD device terminal, functioning as a current injection node, and applying voltage sources of a known voltage level (e.g., zero volt or ground) to all p-polarity ESD device terminals connected on the same network to the given n-polarity terminal. The currents in each of the respective conductors connected to the given current injection node are then measured and may be stored (e.g., in a database or alternative storage element) for subsequent evaluation. The linear network analysis is thus performed by removing identified ESD devices from the evaluation. This inventive approach is discussed in further detail below with reference to FIGS. 5 and 6. As an added benefit, by partitioning the network into a plurality of sub-networks, linear network analysis for multiple ESD tests can be performed substantially concurrently (e.g., in parallel), thereby advantageously reducing the required ESD verification time.

As stated above, the network analysis is performed using linear circuit analysis techniques, including current tracing, such as provided in VoltageStorm® Lightning (a registered trademark of Cadence Design Systems, Inc.) or Apache® RedHawk (a registered trademark of Apache Design Solutions, Inc.), rather than using a slower, nonlinear IV modeling approach, such as, for example, SPICE (simulation program with integrated circuit emphasis) or a derivative thereof (e.g., H-SPICE, P-SPICE, IS_SPICE, etc.). Other linear circuit analysis techniques may be similarly employed, as will be known to those skilled in the art. The ESD conditions under which the network is evaluated may be approximated, for example, using a human body model (HBM) model by injection of about one to two amperes of direct current (DC) into an I/O pad of the IC. Technology-based rules can then be used to check interconnects for excessive current density (e.g., per unit width or per unit area) and/or excessive voltage drop or total resistance (voltage drop and total resistance being essentially equivalent).

Results of the network analysis are preferably output in step 150. Step 150 may comprise, for example, identifying interconnections between identified ESD devices and other elements, power supplies, etc., in the IC which may be prone to failure during an ESD event and storing the identified interconnections in an output file, or an alternative failure indication mechanism. Such determination can be made, for example, by generating a list (e.g., database) of interconnections coupled to an identified ESD device and the corresponding currents therein, and then comparing these currents to a prescribed threshold level to determine whether or not the current in each of these interconnections exceeds the threshold level. The list of interconnections may be sorted by, for example, current, resistance, and/or voltage. The prescribed threshold level may be a function of, for example, technology-based rules, type of conductor (e.g., metal, polysilicon, etc.), or alternative characteristics which may be used to predict one or more ESD failures in the IC. Once interconnections that are prone to failure have been identified, appropriate corrective action can be taken to thereby eliminate the potential for ESD failure in the IC. Such corrective action may comprise, for example, increasing the width of a given interconnection, increasing the number of contacts and/or vias associated with the given interconnection, changing the type of material used to form the interconnection (e.g., replacing polysilicon with metal), etc. This corrective action step may, optionally, be automated upon detection of an ESD-related failure.

Figure 2:
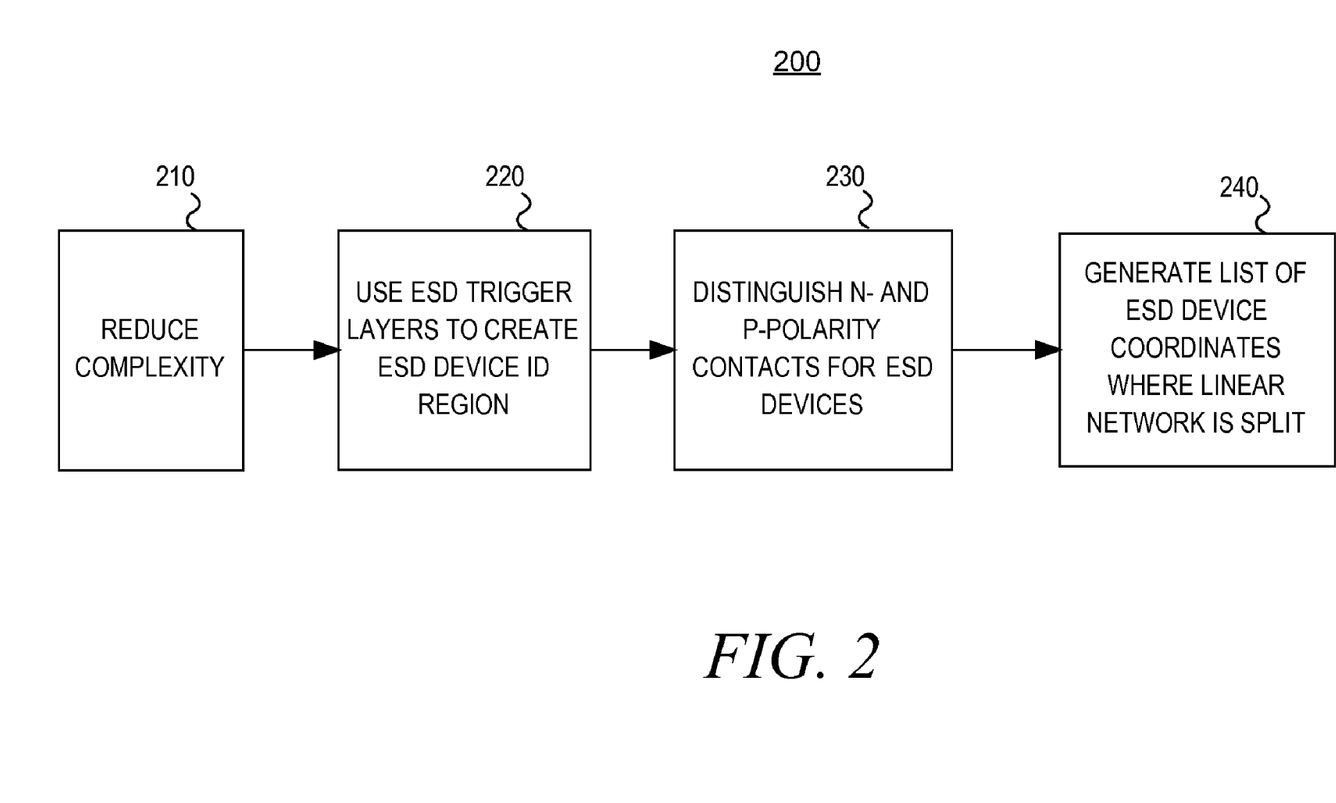
FIG. 2 is a flow diagram showing an exemplary method for analyzing the layout of devices, in accordance with an embodiment of the invention.

FIG. 2 is a flow diagram depicting an exemplary method 200 for analyzing layout parameters corresponding to an IC layout, in accordance with another aspect of the invention. Method 200 may be implemented, for example, in at least a portion of the layout analysis step 120 shown in FIG. 1. Method 200 receives an input, which may be, for example, a GDSII file containing the full IC database or a subset thereof, and generates as an output a trimmed GDSII database of reduced size and complexity. The size of the final trimmed database may be less than one-third the size of the original input database using techniques of the present invention. Method 200, thus, beneficially enables a chip-level and block-level ESD simulation to be performed in significantly less time compared to conventional approaches.

Method 200 begins in step 210, which is an optional step wherein one or more procedures may be utilized to beneficially reduce the complexity of a received input dataset (e.g., GDSII database) including layout parameters. As stated above, the input dataset may represent the full IC layout database or a portion thereof. Reducing the complexity of the input dataset facilitates subsequent processing and is therefore desirable. Step 210 may include, for example, layout trimming. An objective of step 210 is, beginning with a full IC database, to generate a reduced database containing only bond pads, interconnect routing from the pads to all identified ESD devices, trimmed power and ground networks, and connections to ESD devices on non-physical GDSII trigger layers. An exemplary layout trimming methodology suitable for use with the invention will be described in further detail below with reference to FIG. 4.

In step 220, ESD trigger layers are used to create one or more ESD device identification regions in the IC based at least in part on the input dataset, which may be the reduced complexity dataset generated in step 210. ESD device identification regions are preferably contiguous regions in the IC in which one or more ESD protection devices reside (e.g., ESD identification region covers one or more ESD devices). As part of step 220, geometries on non-physical trigger layers are preferably output which surround and uniquely identify the ESD protection devices. Alternatively, network topology can be used to identify active areas of the ESD device and take an oversize of those areas so there is one, merged region which identifies the ESD device location.

In step 230, n- and p-polarity contacts for ESD devices are distinguished. Specifically, connections between the interconnect routing and the ESD trigger layers are preferably extracted and mapped onto either n-polarity or p-polarity pseudo contact layers based at least in part on the type of device and connections to either power, ground or to an I/O pad. This may be performed through operations on the database, e.g., GDS manipulation through commercial design rule check (DRC) software. These operations may be purely geometrical (e.g., the n-polarity contact for diodes is simply the part of the diode which contains N+ diffusion), or the operations may be connectivity-based (e.g., n-polarity snapback contacts are connected to VSS or ground). Finally, pad pin names are preferably output as text labels onto standard GDSII levels.

Step 240 comprises generating the trimmed output, including a list of ESD device coordinates where the linear network in the ESD device identification region is split (e.g., where an open circuit exists upon removal of an ESD device).

Figure 3:
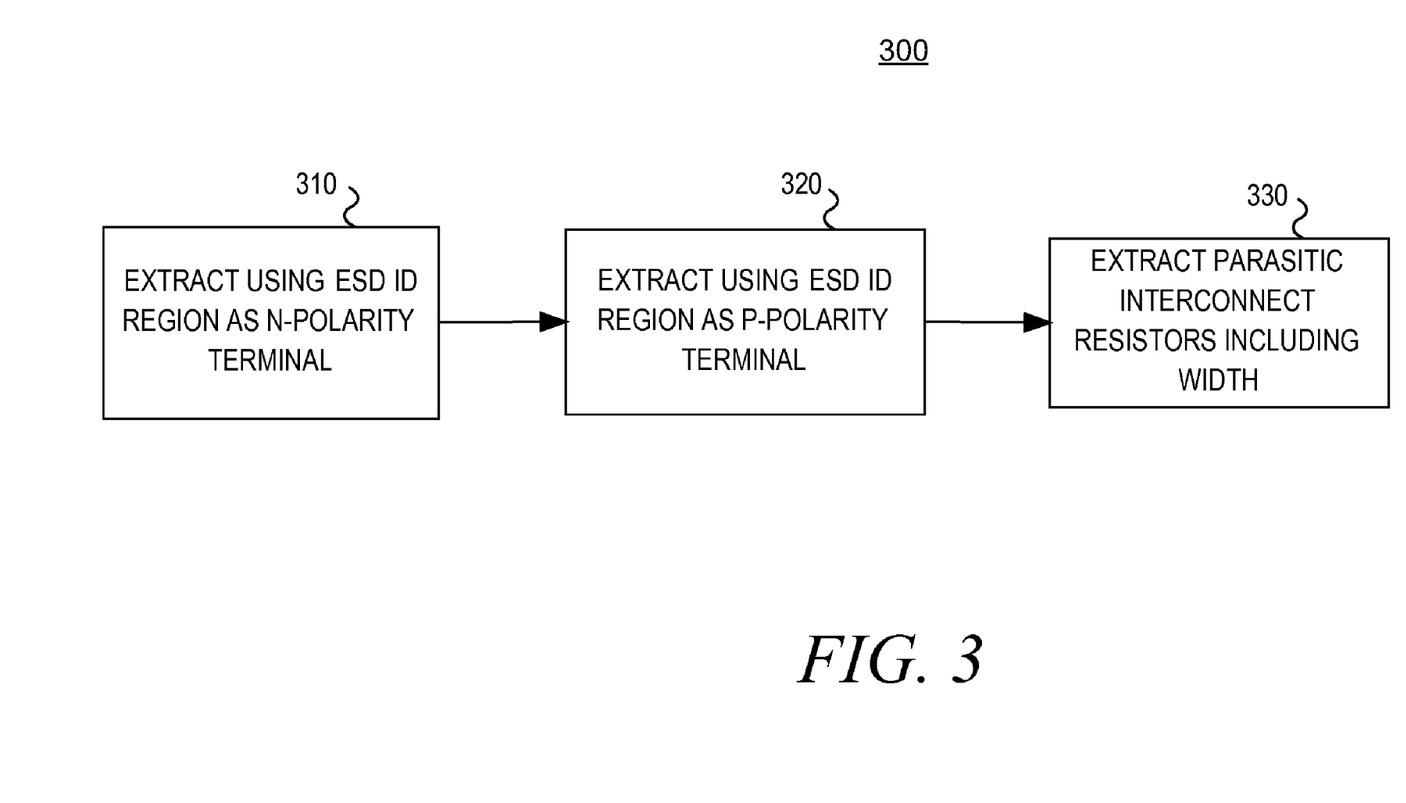
FIG. 3 is a flow diagram showing an exemplary method for extracting devices, in accordance with an embodiment of the invention.

FIG. 3 is a simplified flow diagram depicting an exemplary method 300 for extracting devices and parasitic elements in at least a portion of the IC (e.g., ESD region) based at least in part on an input dataset, in accordance with an embodiment of the invention. This extraction is preferably performed using a high-capacity extraction software, e.g., Hercules™ LVS or Calibre™ LVS, for device extraction, followed by Star-RCXT™, for parasitic extraction; or VoltageStorm® XT, for device extraction, followed by Fire & Ice® QX, for parasitic extraction, as previously stated. Method 300 may be implemented, for example, in at least a portion of the extraction step 130 shown in FIG. 1.

Method 300 preferably begins in step 310, wherein device extraction is performed using the ESD identification region as an n-polarity terminal. In this step, the ESD identification region is extracted to represent a source terminal of the device and is used to create a low-resistance region (e.g., about a few ohms or less) connected to n-polarity contacts. By extracting this region with a small or negligible resistance, contacting any location of this region with a voltage or current source is effectively the same as contacting all of the n-polarity contacts at the same time. Preferably, dimensional characteristics of the extracted ESD identification region as an n-polarity terminal are also obtained. Dimensional characteristics may include, but are not limited to, geometric attributes of devices and connections in at least a portion of the IC (e.g., width).

In step 320, device extraction is performed using the ESD identification region as a p-polarity terminal. In this step, the ESD identification region is extracted to represent a sink terminal of the device and is used to create a low-resistance region connected to p-polarity contacts. As in step 310, by extracting this region with a small or negligible resistance, contacting any location of this region with a voltage or current source is effectively the same as contacting all of the p-polarity contacts at the same time. Preferably, dimensional characteristics of the extracted ESD identification region as a p-polarity terminal are also obtained. The extraction of n- and p-polarity device terminals in steps 310 and 320, respectively, enables the IC network to be partitioned so as to advantageously simplify subsequent network analysis. This n- and p-polarity terminal identification also simplifies the network boundary conditions.

In step 330, an extraction of parasitic interconnect resistance, or other parasitic elements, is performed. Preferably, dimensional characteristics of the extracted parasitic interconnect resistance are also obtained. Based on the extraction process set forth in illustrative method 300, one or more netlists are preferably generated including connectivity information and dimensional characteristics for the extracted devices and parasitic interconnect resistance associated with at least ESD protection circuitry in the IC.

Figure 4:
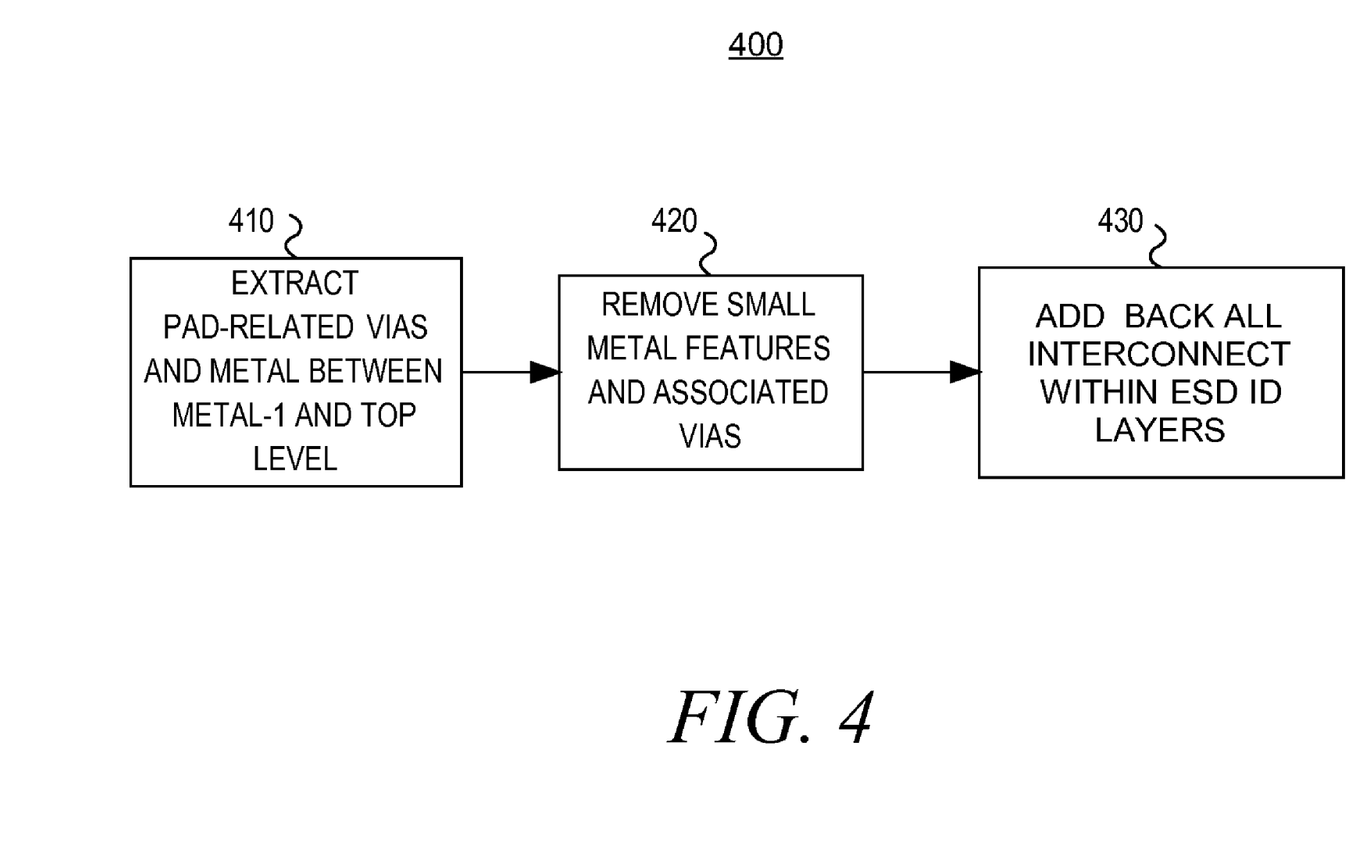
FIG. 4 is a flow diagram showing an exemplary method for trimming a design, in accordance with an embodiment of the invention.

FIG. 4 is a flow diagram depicting an exemplary layout trimming method 400, in accordance with an embodiment of the invention. Trimming method 400 may be implemented in at least a portion of step 210 shown in FIG. 2. Method 400 preferably receives an input dataset including layout parameters and serves to generate, as an output, a new database, or alternative temporary storage element (e.g., data file, memory, etc.), including only those elements of the IC design required for ESD simulation.

In step 410, pad-connected interconnect between a first metallization layer (e.g., metal-1) and a top metallization layer are extracted and preferably stored in memory until the geometry manipulation has been completed, at which point the results are written to the output database (as will be discussed in further detail below in conjunction with step 430). Pads are preferably identified based on text labels, although alternative identification means are similarly contemplated. As part of step 410, pad pin names may be added to the output database as text labels onto standard GDSII levels (e.g., as at least part of an annotation layer in the output dataset). In step 420, metal features that are smaller than a prescribed dimension are removed along with vias associated with these trimmed geometries. Optionally, this trimming is done only for power- and ground-related pads. Next, in step 430, interconnect routing (regardless of size) within ESD identification regions is extracted. The extracted geometries from the geometry manipulation (e.g. trimming) performed in steps 410, 420 and 430, are then written to the output database. Preferably, contacts are included but not necessarily diffusion or polysilicon layers. These contacts are optionally output onto n-polarity or p-polarity contact layers based at least in part on the type of device or on connections to either power, ground, or an I/O pad. The ESD identification layer itself may also be included in the output database as a non-physical layer.

Figure 5:
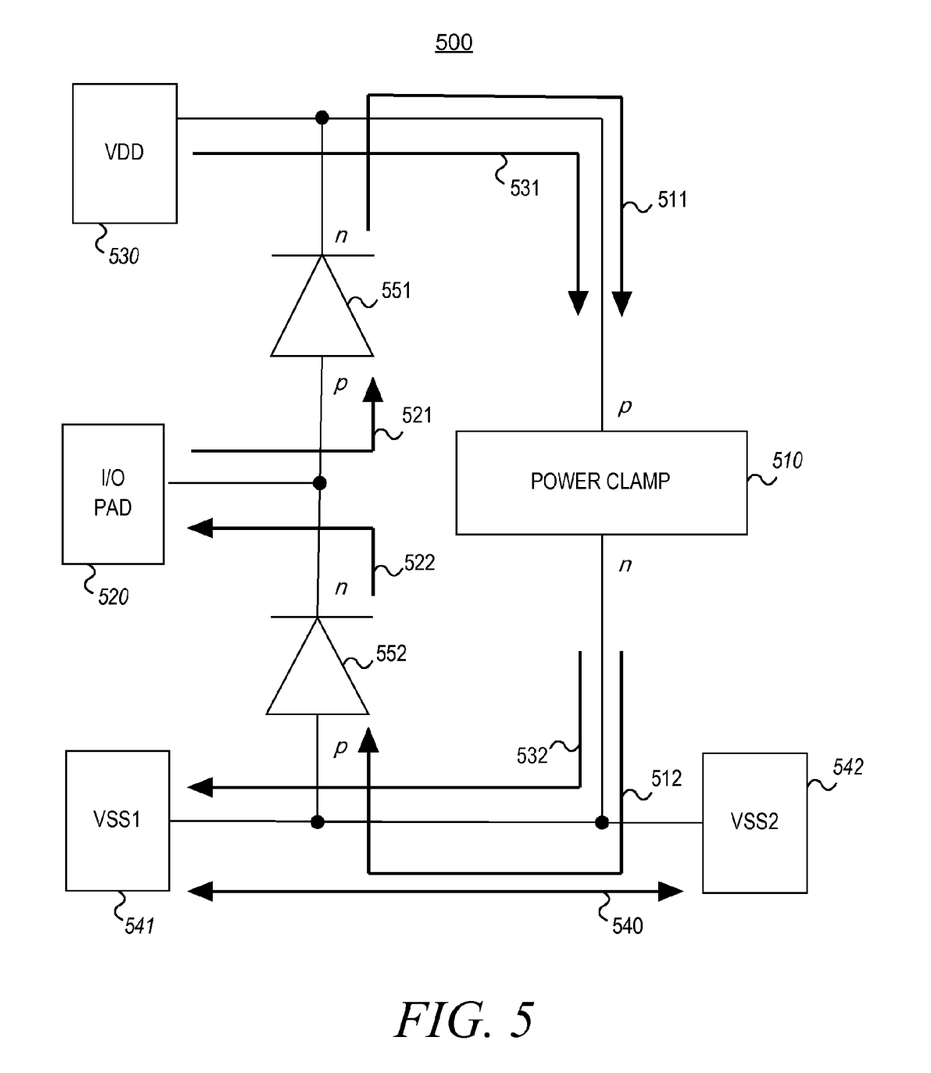
FIG. 5 is a schematic diagram depicting an illustrative ESD circuit with which methodologies of the present invention may be employed.

With reference now to FIG. 5, there is shown a schematic diagram illustrating an exemplary ESD circuit 500 with which methodologies of the present invention may be employed. In ESD circuit 500, Vdd 530 represents a power pad, Vss1 541 and Vss2 542 represent ground pads which, in this embodiment, are connected together, and I/O pad 520 represents an input/output device connection. ESD circuit 500 includes a power clamp 510 connected between power pad 530 and ground pads 541 and 542. ESD circuit 500 further includes a first ESD protection diode 551 having a cathode (n-polarity terminal) connected to power pad 530 and an anode (p-polarity terminal) connected to I/O pad 520, and a second ESD protection diode 552 having a cathode connected to I/O pad 520 and an anode connected to ground pads 541, 542. Power clamp 510, first diode 551 and second diode 552 are preferably all ESD devices. It is to be appreciated that ESD devices may be defined as such based on circuit usage, although ESD devices may also be physically distinct from other devices in a given circuit that are not used in conjunction with an ESD event. It is to be further understood that ESD circuit 500 is merely illustrative, and that the invention is not limited to the specific arrangement shown. For example, more than one power pad may be included in ESD circuit 500, and there may be multiple I/O pads with power or ground pads which may be common or not.

As discussed above with reference to step 140 of FIG. 1, various ESD tests can be run in parallel by means of network partitioning. For example, path 511 is indicative of current flow between first ESD protection diode 551 and power clamp 510, and path 512 is indicative of current flow between second ESD protection diode 552 and the power clamp. Likewise, paths 521 and 522 are indicative of current flows between I/O pad 520 and the first and second ESD protection diodes, respectively. Path 531 is indicative of current flow between power pad 530 and power clamp 510, and path 532 is indicative of current flow between the power clamp and ground pad 541. Path 540 is indicative of current flow in the low-resistance ground network(s) comprising ground pads 541 and 542. It is worth noting that each ESD component, including power clamp 510, first ESD diode 551 and second ESD diode 552, includes an n-polarity terminal (or node) and a p-polarity terminal, and that current is defined as being sourced from an n-polarity terminal and returned (sink) to a p-polarity terminal. Each path, 511, 512, 521, 522, 531, 532, and 540, preferably represents a separate ESD test to be performed in the circuit 500.

Figure 6:
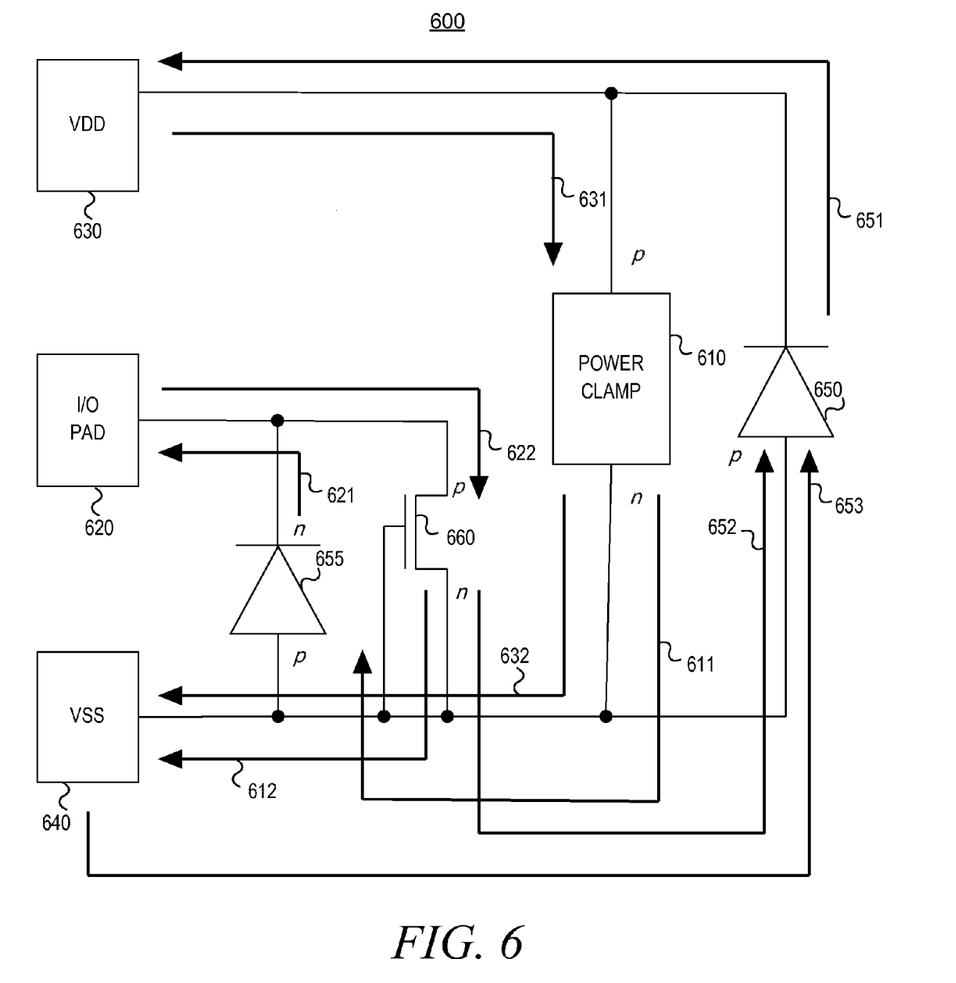
FIG. 6 is a schematic diagram depicting another illustrative ESD circuit with which methodologies of the present invention may be employed.

FIG. 6 is a schematic diagram depicting another illustrative ESD circuit 600 with which methodologies of the present invention may be employed. Circuit 600 preferably comprises a power pad (Vdd) 630, an I/O pad 620, and a ground pad (Vss) 640. Circuit 600 further includes a power clamp 610 connected between power and ground pads 630 and 640, respectively, an ESD I/O protection diode 655 having a cathode (n-polarity terminal) connected to I/O pad 620 and an anode (p-polarity terminal) connected to ground pad 640, an NMOS snapback device 660 having a drain (p-polarity terminal) connected to the I/O pad, and a source (n-polarity terminal) and gate (G) connected to the ground pad, and a power-to-ground protection diode 650 having a cathode (n-polarity terminal) connected to power pad 630 and an anode (p-polarity terminal) connected to ground pad 640.

As discussed above with reference to step 140 of FIG. 1, various ESD tests can be run in parallel by means of network partitioning. For example, path 511 is indicative of current flow between first ESD protection diode 551 and power clamp 510, and path 512 is indicative of current flow between second ESD protection diode 552 and the power clamp. Likewise, paths 521 and 522 are indicative of current flows between I/O pad 520 and the first and second ESD protection diodes, respectively. Path 531 is indicative of current flow between power pad 530 and power clamp 510, and path 532 is indicative of current flow between the power clamp and ground pad 541. Path 540 is indicative of current flow in the low-resistance ground network(s) comprising ground pads 541 and 542. It is worth noting that each ESD component, including power clamp 510, first ESD diode 551 and second ESD diode 552, includes an n-polarity terminal (or node) and a p-polarity terminal, and that current is defined as being sourced from an n-polarity terminal and returned (sink) to a p-polarity terminal. Each path, 511, 512, 521, 522, 531, 532, and 540, preferably represents a separate ESD test to be performed in the circuit 500.

Figure 7:
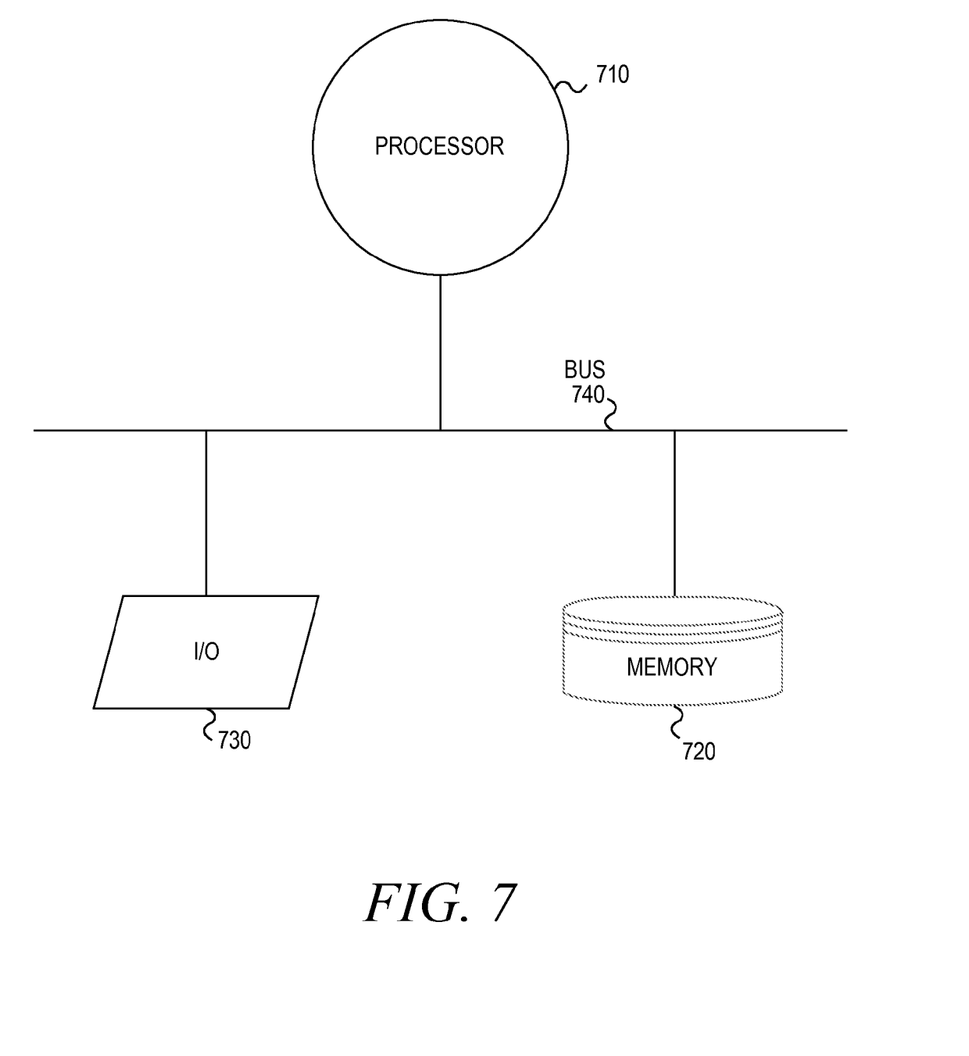
FIG. 7 is a block diagram depicting an exemplary processing system in which techniques of the present invention may be implemented, in accordance with an embodiment of the invention.

The methodologies of embodiments of the invention may be particularly well-suited for use in an electronic device or alternative processing system (e.g., EDA system, etc.). For example, FIG. 7 is a block diagram depicting an exemplary processing system 700 formed in accordance with an aspect of the invention. System 700 may include a processor 710, memory 720 coupled to the processor (e.g., via a bus 740 or alternative connection means), as well as input/output (I/O) circuitry 730 operative to interface with the processor. The processor 710 may be configured to perform at least a portion of the methodologies of the present invention, illustrative embodiments of which are shown in the previous figures and described herein above.

It is to be appreciated that the term "processor" as used herein is intended to include any processing device, such as, for example, one that includes a central processing unit (CPU) and/or other processing circuitry (e.g., network processor, digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more DSPs with associated memory, application-specific integrated circuit(s), functional circuitry, one or more operatively programmed general purpose digital computers with associated memory, etc). Given the teachings of the invention provided herein, one of ordinary skill in the art will be able to contemplate other implementations of the components of the invention.

At least a portion of the illustrative techniques of the present invention may be implemented in the manufacture of an integrated circuit. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A processor-implemented method for verifying electrostatic discharge (ESD) device connectivity in an integrated circuit, the method comprising the steps of:
   receiving an input dataset including layout parameters corresponding to the integrated circuit;
   identifying ESD devices based at least in part on the input dataset;
   extracting devices and parasitic elements in at least a portion of the integrated circuit based at least in part on the input dataset;
   generating a file including connectivity information and dimensional characteristics for extracted devices and parasitic elements associated with at least the identified ESD devices in the integrated circuit;
   identifying at least one ESD test based on the identified ESD devices and on connectivity to the identified ESD devices; and
   performing by at least one processor a linear network analysis for each identified ESD test based at least in part on the file;
   wherein the step of performing the linear network analysis for each identified ESD test comprises the steps of:
      evaluating the identified ESD test under ESD conditions, wherein the identified ESD devices are removed from the evaluation;
      based at least in part on the evaluation, identifying one or more conductive connections included in the identified ESD test as prone to failure; and
      outputting one or more representations of the one or more conductive connections identified as prone to failure;
   wherein the one or more conductive connections are identified as prone to failure responsive to one or more of:
      the one or more conductive connections having current densities greater than a first prescribed threshold; and
      the one or more conductive connections having voltage drops greater than a second prescribed threshold;
   wherein the step of identifying ESD devices comprises using at least one ESD trigger layer included in the layout parameters to create at least one ESD device identification region in the integrated circuit; and
   wherein the step of extracting devices and parasitic elements in at least a portion of the integrated circuit comprises the steps of:
      performing a first device extraction in which a given ESD identification region is extracted to represent a source terminal of a given ESD device; and
      performing a second device extraction in which the given ESD identification region is extracted to represent a sink terminal of the given ESD device.

2. The method of claim 1, wherein the input dataset comprises a representation of at least one of planar geometric shapes, text labels and component parameters relating to the integrated circuit.

3. The method of claim 1, wherein the step of identifying ESD device terminals comprises providing an association between at least one input/output pad and a power or ground connection corresponding to the input/output pad in the integrated circuit.

4. The method of claim 1, wherein the step of identifying ESD devices comprises manipulating the input dataset by using device and pad connectivity or an extracted netlist topology to identify and create at least one ESD device identification region in the integrated circuit.

5. The method of claim 4, wherein the ESD device identification region comprises a contiguous region in the integrated circuit in which at least one ESD protection device resides.

6. The method of claim 4, wherein the at least one ESD identification region is used as at least one of a current and a voltage injection point in the step of performing the linear network analysis.

7. The method of claim 1, wherein the step of identifying ESD devices comprises distinguishing n- and p-polarity terminals for the identified ESD devices based, at least in part, on the input dataset.

8. The method of claim 1, wherein the step of identifying ESD devices further comprises the step of:
   generating a list of ESD device coordinates where a linear network in the ESD device identification region is split upon removal of at least one identified ESD device.

9. The method of claim 1, wherein the step of identifying ESD devices comprises reducing a complexity of the received input dataset.

10. The method of claim 9, wherein the step of reducing a complexity of the received input dataset comprises trimming the input dataset by generating an output dataset including only those elements in the integrated circuit required for ESD simulation.

11. The method of claim 10, wherein the step of trimming comprises the steps of:
    adding to the output dataset vias and metal between metal-1 and top level, wherein the vias and metal are related to at least one pad;
    removing from the output dataset metal features smaller than a prescribed dimension, along with vias associated with these metal features;
    adding to the output dataset interconnect within at least one ESD identification layer.

12. The method of claim 11, wherein the at least one pad is identified based at least in part on at least one text label.

13. The method of claim 11, wherein the step of removing comprises removing from the output dataset metal features connected to power and ground networks that are smaller than a prescribed dimension, along with vias associated with these metal features.

14. The method of claim 10, wherein the networks to be extracted and trimmed are identified based on pad labels.

15. The method of claim 9, wherein the step of reducing a complexity of the received input dataset comprises the steps of:
    generating an output dataset based on the input dataset, the output dataset including at least one of: power and ground networks connected to identified ESD devices in the integrated circuit; interconnect routing for identified ESD devices on mask levels between a first metallization layer and a final passivation layer; geometries on non-physical trigger layers which surround and uniquely identify ESD protection devices; and pad pin names as at least part of an annotation layer in the output dataset;

removing from the output dataset metal features connected to power and ground networks that are smaller than a prescribed dimension, along with vias associated with these metal features; and mapping and extracting connections between interconnect routing and ESD trigger layers onto one of n-polarity and p-polarity pseudo contact layers based at least in part on a type of device and connections to one of power, ground and an I/O pad in the integrated circuit.

16. The method of claim 1, wherein the step of performing a linear network analysis for each identified ESD test comprises dividing the linear network analysis into a plurality of processing components, at least two of the processing components being performed substantially concurrently.

17. The method of claim 1, wherein:

the step of identifying ESD devices comprises using at least one ESD trigger layer included in the layout parameters to create at least one ESD device identification region in the integrated circuit, and, for each of the identified ESD devices, distinguishing terminals of the identified ESD devices as being one of a first polarity type and a second polarity type based, at least in part, on the input dataset; and the step of performing the linear network analysis, for each of a given one of the identified ESD devices comprises injecting a prescribed current into the terminal of the first polarity type of the given ESD device and measuring at least one of the total voltage and one or more current densities at one or more respective points along at least one path from the terminal of the first polarity type to one of at least one pad coupled to the given ESD device and at least one terminal of the second polarity type corresponding to at least one other identified ESD device in the integrated circuit.

18. A system for verifying electrostatic discharge (ESD) device connectivity in an integrated circuit, the system comprising:

memory; and at least one processor coupled to the memory, the at least one processor being operative: (i) to receive an input dataset including layout parameters corresponding to the integrated circuit; (ii) to identify ESD devices based at least in part on the input dataset; (iii) to extract devices and parasitic elements in at least a portion of the integrated circuit based at least in part on the input dataset; (iv) to generate a file including connectivity information and dimensional characteristics for extracted devices and parasitic elements associated with at least the identified ESD devices in the integrated circuit; (v) to identify at least one ESD test based on the identified ESD devices and on connectivity to the identified ESD devices; and (vi) to perform a linear network analysis for each identified ESD test based at least in part on the file;

wherein the operation of performing the linear network analysis for each identified ESD test comprises the operations of:

evaluating the identified ESD test under ESD conditions, wherein the identified ESD devices are removed from the evaluation;

based at least in part on the evaluation, identifying one or more conductive connections included in the identified ESD test as prone to failure; and outputting one or more representations of the one or more conductive connections identified as prone to failure;

wherein the one or more conductive connections are identified as prone to failure responsive to one or more of:

the one or more conductive connections having current densities greater than a first prescribed threshold; and the one or more conductive connections having voltage drops greater than a second prescribed threshold;

wherein the operation of identifying ESD devices comprises using at least one ESD trigger layer included in the layout parameters to create at least one ESD device identification region in the integrated circuit; and wherein the operation of extracting devices and parasitic elements in at least a portion of the integrated circuit comprises the operations of:

performing a first device extraction in which a given ESD identification region is extracted to represent a source terminal of a given ESD device; and performing a second device extraction in which the given ESD identification region is extracted to represent a sink terminal of the given ESD device.

19. An article of manufacture for verifying electrostatic discharge (ESD) device connectivity in an integrated circuit, comprising a machine readable medium containing one or more programs which, when executed, implement the steps of:

receiving an input dataset including layout parameters corresponding to the integrated circuit;

identifying ESD devices based at least in part on the input dataset;

extracting devices and parasitic elements in at least a portion of the integrated circuit based at least in part on the input dataset;

generating a file including connectivity information and dimensional characteristics for extracted devices and parasitic elements associated with at least the identified ESD devices in the integrated circuit;

identifying at least one ESD test based on the identified ESD devices and on connectivity to the identified ESD devices; and performing a linear network analysis for each identified ESD test based at least in part on the file;

wherein performing the linear network analysis for each identified ESD test comprises the steps of:

evaluating the identified ESD test under ESD conditions, wherein the identified ESD devices are removed from the evaluation;

based at least in part on the evaluation, identifying one or more conductive connections included in the identified ESD test as prone to failure; and outputting one or more representations of the one or more conductive connections identified as prone to failure;

wherein the one or more conductive connections are identified responsive to one or more of:

the one or more conductive connections having current densities greater than a first prescribed threshold; and the one or more conductive connections having voltage drops greater than a second prescribed threshold;

wherein the step of identifying ESD devices comprises using at least one ESD trigger layer included in the layout parameters to create at least one ESD device identification region in the integrated circuit; and wherein the step of extracting devices and parasitic elements in at least a portion of the integrated circuit comprises the steps of:
  performing a first device extraction in which a given ESD identification region is extracted to represent a source terminal of a given ESD device; and
  performing a second device extraction in which the given ESD identification region is extracted to represent a sink terminal of the given ESD device.

* * * * *